(12) United States Patent
Ugranarasimhaiah

(10) Patent No.: US 10,983,725 B2
(45) Date of Patent: Apr. 20, 2021

(54) MEMORY ARRAY ARCHITECTURES FOR MEMORY QUEUES

(71) Applicant: Synopsys, Inc., Mountain View, CA (US)

(72) Inventor: Chandrashekar Bhupasandra Ugranarasimhaiah, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 27 days.

(21) Appl. No.: 16/289,841

(22) Filed: Mar. 1, 2019

(65) Prior Publication Data

US 2019/0272120 A1    Sep. 5, 2019

(30) Foreign Application Priority Data

Mar. 1, 2018  (IN) .............................. 201811007654

(51) Int. Cl.
*G06F 3/06* (2006.01)
*G11C 7/10* (2006.01)
(Continued)

(52) U.S. Cl.
CPC .......... *G06F 3/0659* (2013.01); *G06F 3/0622* (2013.01); *G06F 3/0673* (2013.01); *G11C 7/10* (2013.01)

(58) Field of Classification Search
CPC .... G06F 3/0622; G06F 3/0659; G06F 3/0673; G11C 7/10; G11C 7/22; G11C 8/12; G11C 7/103
(Continued)

(56) References Cited

U.S. PATENT DOCUMENTS 4,689,771 A  *  8/1987  Wang .................... G11C 7/22
                                                    365/233.5
4,827,473 A      5/1989  Tsuzuki et al.
                 (Continued)

OTHER PUBLICATIONS

Marsic, I., "Computer Networks: Performance and Quality of Service," Dept. of Electrical and Computer Engineering and the CAIP Center, Rutgers University, pp. 1-151 (2010).
(Continued)

*Primary Examiner* — Idriss N Alrobaye
*Assistant Examiner* — Henry W Yu
(74) *Attorney, Agent, or Firm* — Sterne, Kessler, Goldstein & Fox P.L.L.C.

(57) ABSTRACT

Memory queues described herein use a single hardware and/or software architecture for a memory array. This memory array can be partitioned to be between one memory sub-array to implement a single memory queue and multiple memory sub-arrays to implement multiple memory queues. Various electrical signals provided by or provided to these multiple memory queues include addressing information to associate these various control signals with one or more of the multiple memory sub-arrays. In some situations, the memory queues can externally associate their corresponding read pointers to entries of one of their memory sub-arrays. In these situations, these memory queues can dynamically associate their read pointers to point to any entry from among their memory arrays and to read the data store therein starting from any random entry within their memory arrays.

20 Claims, 11 Drawing Sheets

(51) Int. Cl.
*G11C 7/22* (2006.01)
*G11C 8/12* (2006.01)

(58) Field of Classification Search
USPC .................................. 710/3, 52, 54, 310
See application file for complete search history.

(56) References Cited

U.S. PATENT DOCUMENTS

| | | | | |
|---|---|---|---|---|
| 6,108,802 | A * | 8/2000 | Kim | G11C 29/003 |
| | | | | 714/42 |
| 8,874,809 | B2 | 10/2014 | Korger | |
| 2003/0223458 | A1* | 12/2003 | Mathews | H04L 12/5601 |
| | | | | 370/474 |
| 2004/0181556 | A1* | 9/2004 | Ko | H03M 13/2732 |
| 2009/0059713 | A1* | 3/2009 | Ijitsu | G11C 29/14 |
| | | | | 365/233.1 |
| 2009/0244976 | A1* | 10/2009 | Kajimoto | G11C 11/5635 |
| | | | | 365/185.11 |
| 2012/0278517 | A1* | 11/2012 | Korger | H04L 49/9047 |
| | | | | 710/53 |
| 2015/0213889 | A1* | 7/2015 | Miura | G11C 13/004 |
| | | | | 365/163 |
| 2016/0035399 | A1* | 2/2016 | Yaraduyathinahalli | G11C 7/22 |
| | | | | 365/189.17 |

OTHER PUBLICATIONS

Ojomu, S.A., "Performance Analysis of VOQ Packet-Switch," Thesis, Dept. of Electronic Engineering, University of Nigeria, Nsukka, 108 pages (Jun. 2009).

* cited by examiner

MEMORY ARRAY ARCHITECTURES FOR MEMORY QUEUES

CROSS-REFERENCE TO RELATED APPLICATIONS

The present application claims the benefit of Patent Appl. No. 201811007654, filed on Mar. 1, 2018 in India, which is incorporated herein by reference in its entirety.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

SPECIFICATION—DISCLAIMERS

In the following Background, Summary, and Detailed Description, headings should not be construed as necessarily limiting. In the following Background, Summary and Detailed Description, the citation or identification of any publication does not signify relevance or status as prior art for any of the claimed or described embodiments.

FIELD(S) OF TECHNOLOGY

This disclosure relates to the field of memory queues, including the memory queues that include single hardware and/or software architecture which can be logically partitioned into multiple sub-arrays.

BACKGROUND

Memory queues are used in a wide variety of applications for storing information. These applications vary from computer architectures for storing instructions for execution by a processor to communication architectures for storing information for delivery within a communication system. These memory queues can be classified as synchronous memory queues or asynchronous memory queues. Synchronous memory queues refer to memory queues that read and/or write data from a single clocking domain whereas asynchronous memory queues refer to memory queues that read data from a first clock domain and write data from a second, asynchronous clock domain.

SUMMARY

The claims signify a brief description of one or more of the innovations, embodiments, and/or examples found within this disclosure. This disclosure describes a multiple first in, first out (FIFO) memory queue. The multiple FIFO memory queue includes a memory array and control logic. The memory array includes memory storage elements which are logically portioned into multiple group of memory storage elements to form multiple memory sub-arrays. The control logic accesses a first memory storage element within a first memory sub-array that is associated with a read pointer, sequentially reads a first plurality of bits starting from a top entry of a first column of memory storage elements having the first memory storage element to provide an output data signal, accesses a second memory storage element within the first memory sub-array that is associated with a write pointer, and sequentially writes a second plurality of bits associated with an input data signal to a second column of memory storage elements having the second memory storage element starting from a bottom entry of the second column.

This disclosure also describes a single first in, random out (FIRO) memory queue. The single FIRO memory queue includes a memory array and control logic. The memory array includes multiple memory storage elements which are arranged into rows and columns. The control logic access a first memory storage element within a first column of memory storage elements that is associated with a read pointer signal, sequentially reads a first plurality of bits starting from the first memory storage element to provide an output data signal, flags the first column to indicate the first includes invalid data in response to reading the first plurality of bits, accesses a second memory storage element within a second column of memory storage elements that has been flagged as including the invalid data, sequentially writes a second plurality of bits associated with an input data signal into the second column, and flags the second column to indicate the second column includes the valid data in response to writing the second plurality of bits.

This disclosure further describes a multiple first in, random out (FIRO) memory queue. The multiple FIRO memory queue includes a memory array and control logic. The memory array includes multiple memory storage elements which are logically portioned into multiple groups of memory storage elements to form multiple memory sub-arrays. The control logic accesses a first memory storage element within a first memory sub-array that is associated with an address included with a read pointer signal; sequentially reads a first plurality of bits starting from the first memory storage element to provide an output data signal, flags a first column of memory storage elements having the first memory storage element to indicate the first column includes invalid data in response to reading the first plurality of bits, accesses a second memory storage element within the first memory sub-array that has been flagged as including the invalid data, sequentially writes a second plurality of bits associated with an input data signal to a second column of memory storage elements having the second memory storage element, and flags the second column to indicate the second column includes the valid data in response to writing the second plurality of bits.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

Exemplary Single First in, First Out (FIFO) Architectures

Figure 1:
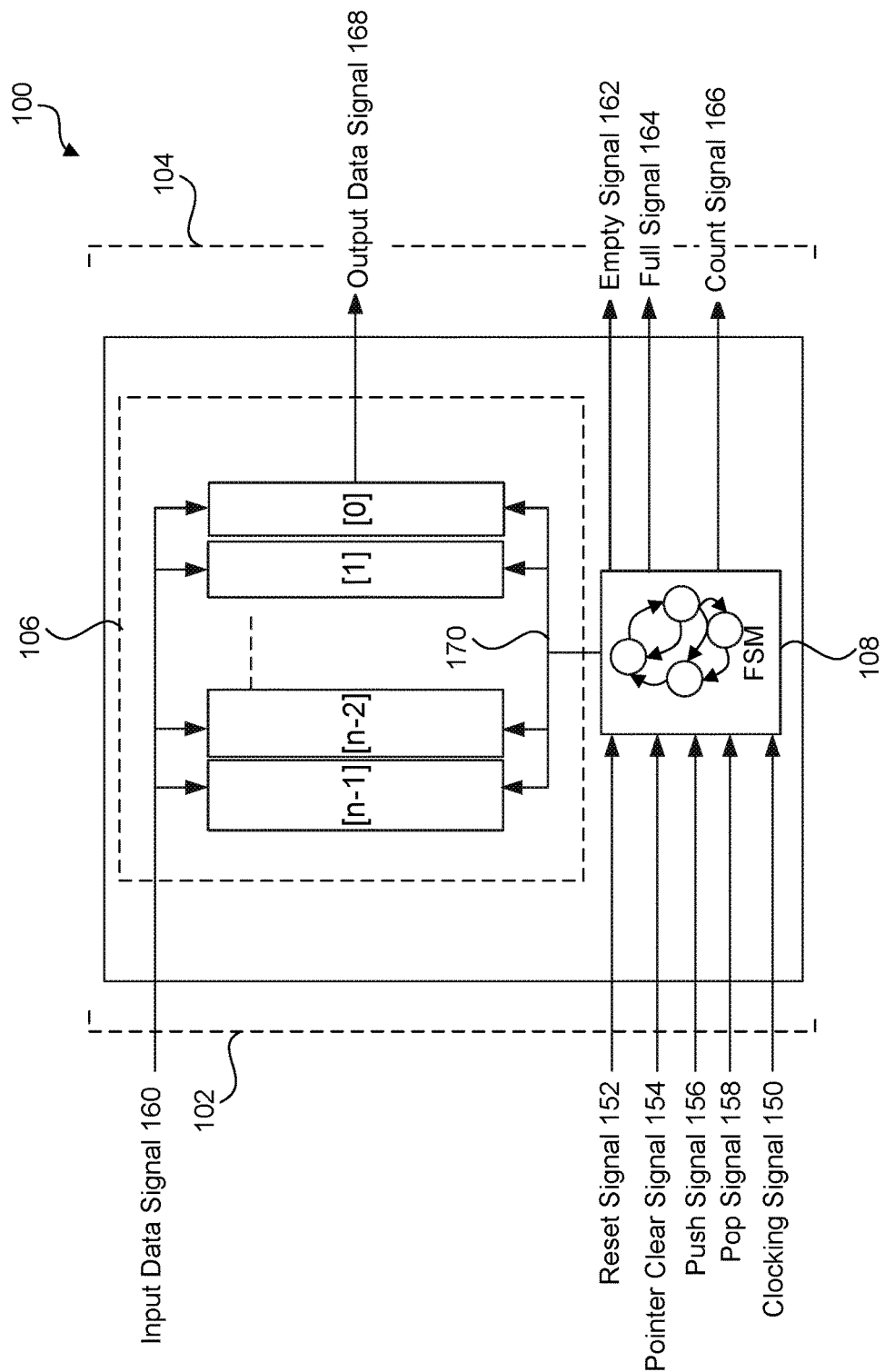
FIG. 1 illustrates a block diagram of an exemplary single first in, first out (FIFO) memory queue according to an exemplary embodiment of the present disclosure.

FIG. 1 illustrates a block diagram of an exemplary single first in, first out (FIFO) memory queue according to an exemplary embodiment of the present disclosure. In the exemplary embodiment illustrated in FIG. 1, a FIFO memory queue 100 represents a single FIFO capable of performing a single writing operation to write data into a memory array during a single clocking cycle of a clocking signal and a single read operation to read data from the memory array during the single clocking cycle of the clocking signal. As to be discussed below, the FIFO memory queue 100 can include control logic to manage various read and write pointers, to generate various status flags, and/or to provide various handshaking signals for interfacing with various electrical, mechanical, and/or electro-mechanical circuits. In an exemplary embodiment, the control logic can include a finite state machine (FSM) implemented in hardware and/or software. In this exemplary embodiment, the FSM can include a register to store one or more of state variables of the FSM and/or various blocks of combinational logic to determine one or more transitions between states of the FSM. In general, the memory array includes multiple memory storage elements which are arranged in a series of rows and a series of columns to form an array. In another exemplary embodiment, the series of columns can be implemented using multiple registers to form an array of multiple registers also referred to as a register bank. As illustrated in FIG. 1, the FIFO memory queue 100 includes an input or write port 102, an output or read port 104, a register bank 106, and an FSM 108.

In the exemplary embodiment illustrated in FIG. 1, the register bank 106 includes multiple registers with each of the multiple registers including a corresponding most significant storage element, also referred to as a top entry, and a corresponding least significant storage element, also referred to as a bottom entry. The FSM 108 associates a write pointer with a top entry of one of the registers from among the register bank 106 and a read pointer with a bottom entry of this register. In an exemplary embodiment, the register bank 106 can be implemented using a random-access memory (RAM) and/or a register file to provide some examples.

As illustrated in FIG. 1, asserting a push signal 156 configures the register bank 106 to operate in a write operation. In an exemplary embodiment, the register bank 106 is configured to operate in the write operation in response to the push signal 156 being asserted indicating a request to write the input data signal 160 into the register bank 106 and a full signal 164 being at a logical zero to indicate the register bank 106 has available storage capacity to store the input data signal 160. In the exemplary embodiment illustrated in FIG. 1, the FSM 108 provides a read/write control signal 170 to access a register element from among the register bank 106 that is associated with the write pointer during the write operation. The FIFO memory queue 100, thereafter, writes m-bits of the input data signal 160 into this accessed register. The FIFO memory queue 100 writes the m-bits of the input data signal 160 into this accessed register starting from the bottom entry of the register. Thereafter, the FSM 108 re-associates the write pointer with a neighboring register from among the register bank 106.

As additionally illustrated in FIG. 1, asserting a pop signal 158 configures the register bank 106 to operate in a read operation. In an exemplary embodiment, the register bank 106 is configured to operate in the read operation in response to the pop signal 158 being asserted indicating a request to read the output data signal 168 from the register bank 106 and an empty signal 162 being at a logical zero to indicate valid data is stored in the register bank 106. In the exemplary embodiment illustrated in FIG. 1, the FSM 108 provides a read/write control signal 170 to access a register element from among the register bank 106 that is associated with the read pointer during the read operation. The FIFO memory queue 100, thereafter, reads m-bits of the output data signal 168 from this accessed register. The FIFO memory queue 100 reads the m-bits of the output data signal 168 from this accessed register starting from the top entry of the register. Thereafter, the FSM 108 re-associates the read pointer with a neighboring register from among the register bank 106.

In the exemplary embodiment illustrated in FIG. 1, the FIFO memory queue 100 maintains a count signal 166. The FSM 108 increments the count signal 166 when the m-bits of the input data signal 160 are written without a simultaneous reading of the m-bits of the output data signal 168 during a single cycle of the clocking signal 150. Similarly, the FSM 108 decrements the count signal 166 when the m-bits of the output data signal 168 are read without a simultaneous writing of the m-bits of the input data signal 160 during the single cycle of the clocking signal 150. The FSM 108 maintains the count signal 166 at its current value when the m-bits of the input data signal 160 are written and the m-bits of the output data signal 168 are read simultaneously during the single cycle of the clocking signal 150. In the exemplary embodiment illustrated in FIG. 1, the count signal 166 represents a digital word having n bits from [(n−1):0] where the integer n represents the number of bits that each register of the register bank 106 is capable of storing. In some situations, the FIFO memory queue 100 can be reset by asserting a reset signal 152 and/or the write and the read pointers can be cleared by asserting a pointer clear signal 154. In the exemplary embodiment illustrated in FIG. 1, the assertion of a reset signal 152 causes the FSM 108 to flush the register bank 106. In this exemplary embodiment, the assertion of the pointer clear signal 154 causes the FSM 108 to clear the write and the read pointers, to set the empty signal 162 to a logical one to indicate no data is stored in the register bank 106, to set the full signal 164 to a logical zero to indicate the register bank 106 has available storage capacity, and to clear the count signal 166.

Exemplary Multiple First in, First Out (FIFO) Architectures

The exemplary embodiments to follow describe a multiple FIFO memory queue whereby the memory array can be logically partitioned into r different memory sub-arrays. As to be described below, the multiple FIFO memory queue can partition the memory array to be between one memory sub-array to implement the single FIFO memory queue as described above in FIG. 1 and multiple memory sub-arrays to implement the multiple FIFO memory queue as to be described in further detail below in FIG. 2.

Figure 2:
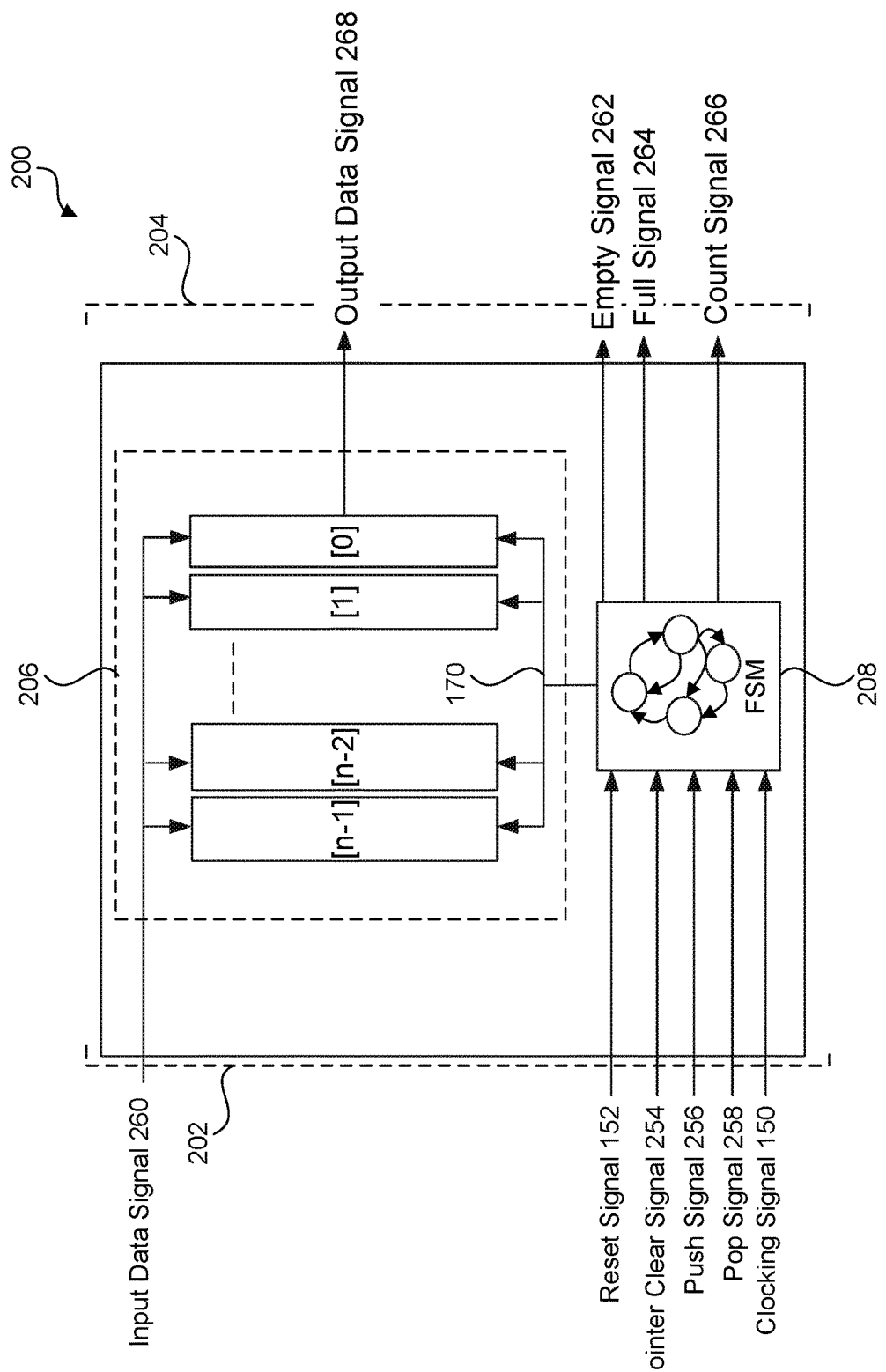
FIG. 2 illustrates a block diagram of an exemplary multiple first in, first out (FIFO) memory queue according to an exemplary embodiment of the present disclosure.

FIG. 2 illustrates a block diagram of an exemplary multiple first in, first out (FIFO) memory queue according to an exemplary embodiment of the present disclosure. Generally, a FIFO memory queue 200 represents a synchronous multiple FIFO having a memory array as described above in FIG. 1 being logically partitioned into r memory sub-arrays to implement r independently operated FIFO memory queues. As to be discussed below, the FIFO memory queue 200 can include control logic to manage various read and write pointers, to generate various status flags, and/or to provide various handshaking signals for interfacing with various electrical, mechanical, and/or electro-mechanical circuits. In an exemplary embodiment, the control logic can include a finite state machine (FSM) implemented in hardware and/or software. In this exemplary embodiment, the FSM can include a register to store one or more of state variables of the FSM and/or various blocks of combinational logic to determine one or more transitions between states of the FSM. In general, the memory array includes multiple memory storage elements which are arranged in a series of rows and a series of columns to form an array. In another exemplary embodiment, the series of columns can be implemented using multiple registers to form an array of multiple registers also referred to as a register bank. As illustrated in FIG. 2, the FIFO memory queue 200 includes an input or write port 202, an output or read port 204, a register bank 206, and an FSM 208. The FIFO memory queue 200 operates in a substantially similar manner as the FIFO memory queue 200 described above in FIG. 1; therefore, only differences between the FIFO memory queue 100 and the FIFO memory queue 200 are to be described in further detail below.

The register bank 206, as illustrated in FIG. 2, can include multiple registers with each of the multiple registers including a corresponding most significant storage element, also referred to as a top entry, and a corresponding least significant storage element, also referred to as a bottom entry in a substantial similar manner as described above in FIG. 1. In an exemplary embodiment, the register bank 206 can be implemented using a random-access memory (RAM) and/or a register file to provide some examples. Moreover, the FSM 208 logically partitions multiple registers of the register bank 206 into r groups of registers, for example, two (2) groups of registers with the integer r being designated by a mode signal 170 and the number of registers in, or offset between, registers in into r groups of registers being designated by an offset signal 172. In another exemplary embodiment, the FSM 208 associates a write pointer with a top entry of a register from among one of the r groups of registers and a read pointer with a bottom entry of this register.

Furthermore, data structures of various signals, such as the pointer clear signal 254, the push signal 256, the pop signal 258, the input data signal 260, the empty signal 262, the full signal 264, the count signal 266, and the output data signal 268 to provide some examples, additionally include address bits that unique identify groups of registers from among the r groups of registers. The FSM 208 uses these address bits to apply these signals to a group of registers from among the r groups of registers which corresponds to these address bits. In an exemplary embodiment, these signals can be represented as $<B_X \ldots B_0><A_Y \ldots A_0>$ with the bits $<B_X \ldots B_0>$ representing the pointer clear signal 154, the push signal 156, the pop signal 158, the input data signal 160, the empty signal 162, the full signal 164, the count signal 166, or the output data signal 168 as described above in FIG. 1 and the bits $<A_Y \ldots A_0>$ represent address bits to uniquely identify a group of registers from among the r groups of registers.

As illustrated in FIG. 2, asserting a push signal 256 configures a group of registers from among the r groups of registers of the register bank 206 identified by the address bits of the push signal 256. In an exemplary embodiment, this group of registers is configured to operate in the write operation in response to the push signal 256 associated with the address of this group of registers being asserted indicating a request to write the input data signal 260 into this group of registers and a full signal 264 associated with the address of this group of registers being at a logical zero to indicate this group of registers has available storage capacity to store the input data signal 260 associated this group of registers. In the exemplary embodiment illustrated in FIG. 2, the FSM 208 associates a write pointer to a bottom entry of a register element from among a group of registers identified by the address bits of the push signal 256. Next, the FSM 208 provides a read/write control signal 270 to access this register element that is associated with the write pointer during the write operation. The FIFO memory queue 200, thereafter, writes m-bits of the input data signal 260 into this accessed register starting from the bottom entry of the register.

As additionally illustrated in FIG. 2, asserting a pop signal 258 configures a group of registers from among the r groups of registers of the register bank 206 identified by the address bits of the pop signal 258. In an exemplary embodiment, this group of registers is configured to operate in the read operation in response to the pop signal 258 associated with the address of this group of registers being asserted indicating a request to read the output data signal 268 from this group of registers and an empty signal 262 associated with the address of this group of registers being at a logical zero to indicate valid data is stored in this group of registers. In the exemplary embodiment illustrated in FIG. 2, the FSM 208 associates a read pointer to a top entry of a register element from among a group of registers identified by the address bits of the pop signal 258. Next, the FSM 208 provides the read/write control signal 270 to access this register element that is associated with the read pointer during the read operation. The FIFO memory queue 200, thereafter, reads m-bits of the output data signal 268 from this accessed register starting from the top entry of the register.

Exemplary Single First in, Random Out (FIRO) Architectures

As discussed above in FIG. 1 and FIG. 2, the FIFO memory queue 100 and the FIFO memory queue 200 internally maintain their corresponding read pointers. For example, the FIFO memory queue 100 and the FIFO memory queue 200. internally associate their corresponding read pointers to top entries of one of their registers. The discussion to follow describes exemplary embodiments for multiple FIRO memory queues which can externally associate their corresponding read pointers to entries of one of their registers. This allows the multiple FIRO memory queues to be described in detail below to dynamically associate their read pointers to point to any entry from among their memory registers. This allows these multiple FIRO memory queues to read the m-bits starting from any random entry within their memory registers elements.

Figure 3:
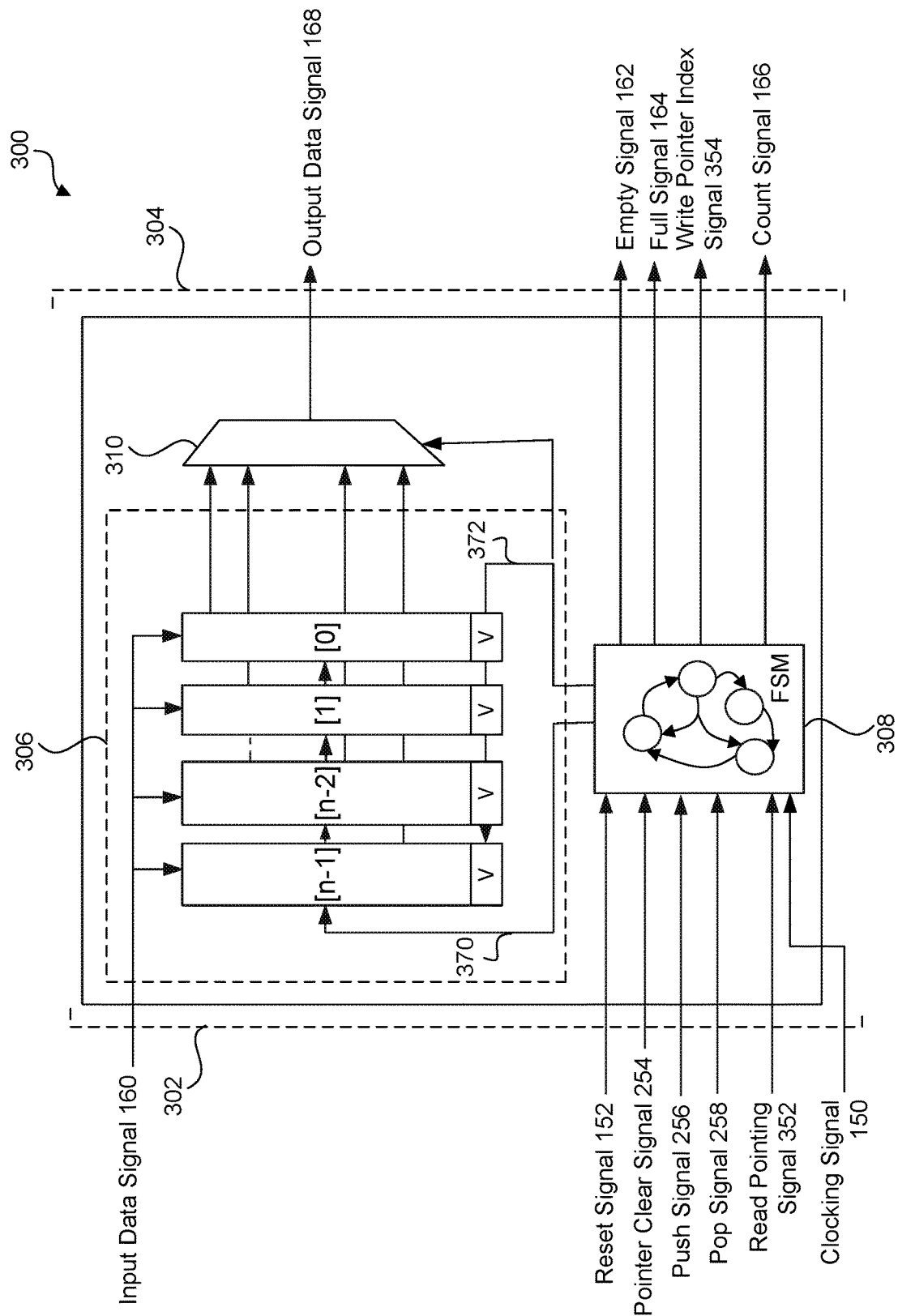
FIG. 3 illustrates a block diagram of an exemplary single first in, random out (FIRO) memory queue according to an exemplary embodiment of the present disclosure.

FIG. 3 illustrates a block diagram of an exemplary single first in, random out (FIRO) memory queue according to an exemplary embodiment of the present disclosure. As to be discussed below, the FIRO memory queue 300 can include control logic to manage various read and write pointers, to generate various status flags, and/or to provide various handshaking signals for interfacing with various electrical, mechanical, and/or electro-mechanical circuits. The control logic can additionally flag data stored within this memory storage element to be invalid after reading the m-bits of data. Thereafter, the FIRO memory queue 300 can write m-bits data into those memory storage elements from among the memory array flagged as having invalid data. In an exemplary embodiment, the control logic can include a finite state machine (FSM) implemented in hardware and/or software. In this exemplary embodiment, the FSM can include a register to store one or more of state variables of the FSM and/or various blocks of combinational logic to determine one or more transitions between states of the FSM. In general, the memory array includes multiple memory storage elements which are arranged in a series of rows and a series of columns to form an array. In another exemplary embodiment, the series of columns can be implemented using multiple registers to form an array of multiple registers also referred to as a register bank. As illustrated in FIG. 3, the FIRO memory queue 300 includes an input or write port 302, an output or read port 304, a register bank 306, an FSM 308, and a data queue 310. The FIRO memory queue 300 operates in a substantially similar manner as the FIFO memory queue 100 described above in FIG. 1; therefore, only differences between the FIFO memory queue 100 and the FIRO memory queue 300 are to be described in further detail below.

During the read operation, the assertion of the pop signal 258 causes the FSM 308 to provide a read/write control signal 370 to access a register element from among the register bank 306 that is associated with the read pointer signal 352. In the exemplary embodiment illustrated in FIG. 3, register bank 306 provides the data stored in this register element to the data queue 310. The FIRO memory queue 300 sequentially reads the m-bits of the output data signal 168 from the data queue 310 in accordance with the read pointer signal 352. Thereafter, the FSM 308 provides a status signal 372 to flag the data stored within this register element to be invalid after reading the m-bits of the output data signal 168 from the data queue 310. In the exemplary embodiment illustrated in FIG. 3, the FSM 308 maintains a register, denoted as "V" in FIG. 3, having flags indicating which register elements from among the register bank 306 include invalid data and which register elements from among the register bank 306 include valid data. This allows the FIRO memory queue 300 to write, also referred to as push, the m-bits of the input data signal 160 into a register element from among the register bank 306 that is flagged as having the invalid data. The FSM 308 can provide a write pointer index signal 354 indicating which register elements from among the register bank 306 include invalid data and which register elements from among the register bank 306 include valid data to various electrical, mechanical, and/or electromechanical circuits. During the write operation, the assertion of the push signal 256 causes the FSM 308 to provide the read/write control signal 370 to access a register element from among the register bank 306 that is flagged as including the invalid data. The FIRO memory queue 300 thereafter writes also referred to as pushes, the m-bits of the input data signal 160 into this register element. Thereafter, FSM 308 of the FIRO memory queue 300 flags the data stored within this register element as being valid data.

Exemplary Packet Router Having the Exemplary Single FIRO Memory Queue

Figure 4:
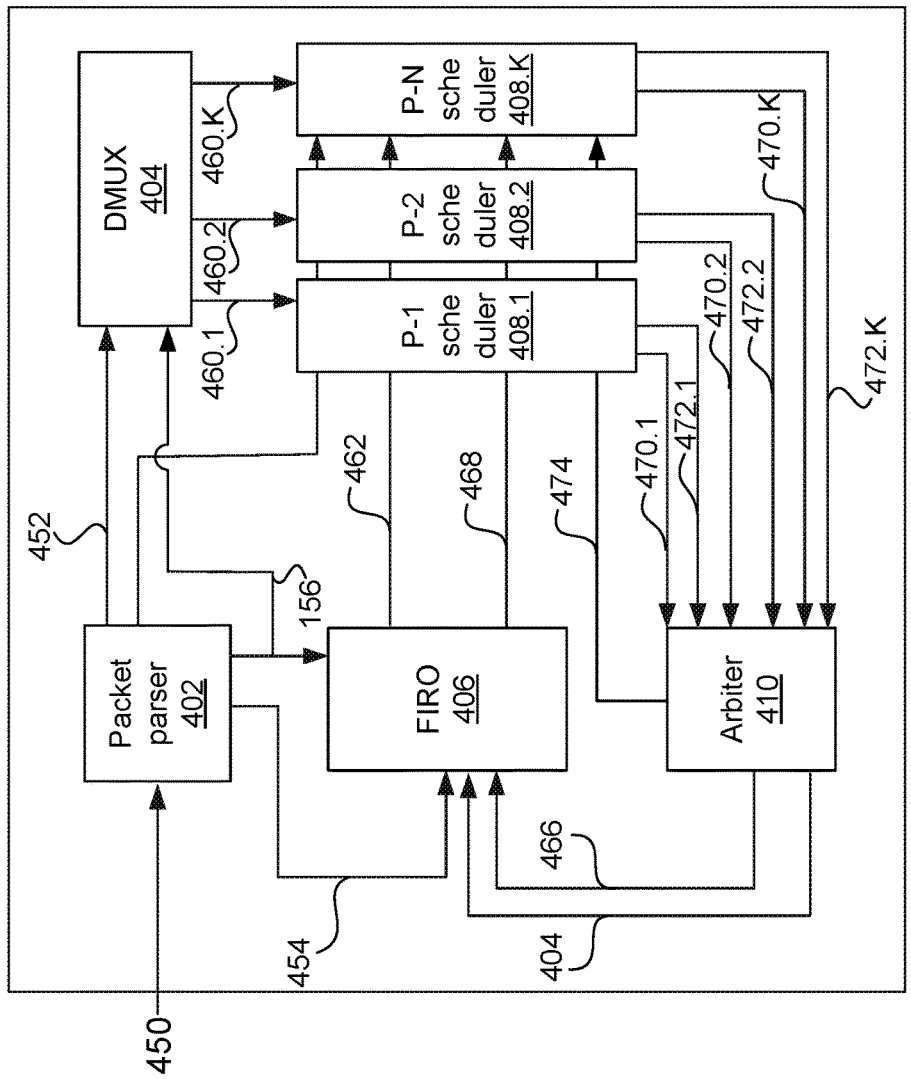
FIG. 4 illustrates a block diagram of an exemplary packet router having the exemplary single FIRO memory queue according to an exemplary embodiment of the present disclosure.

FIG. 4 illustrates a block diagram of an exemplary packet router having the exemplary single FIRO memory queue according to an exemplary embodiment of the present disclosure. In the exemplary embodiment illustrated in FIG. 4, a packet router 400 routes a packet header of an input data packet received at an ingress port to provide a packet header for an output data packet at a corresponding egress port from among multiple egress ports based upon information within a packet header of the input data packet. In the exemplary embodiment illustrated in FIG. 4, the packet router 400 includes a packet parser 402, a demultiplexer 404, a FIRO memory queue 406, packet schedulers 408.1 through 408.$k$, and an arbiter 410. Those skilled in the relevant art(s) will recognize the input data packet can include an information payload which is not illustrated in FIG. 4. The FIRO memory queue 406, as to be discussed in further detail below, can be replaced or alternatively, supplemented, with a random-access memory (RAM) and/or a register file to enable routing of the packet header and the information payload in a substantially similar manner as to be described below.

As illustrated in FIG. 4, the packet parser 402 extracts routing information 452 indicating the corresponding egress port from among multiple egress ports and other packet information 454 from a packet header of an input data packet 450. The packet parser 402 provides the routing information 452 to the demultiplexer 408 and the other packet information 454 to the FIRO memory queue 404. The other packet information 454 can represent an exemplary embodiment of the input data signal 160 as described above in FIG. 1. Thereafter, the packet parser 402 asserts a push signal 456 to enable the demultiplexer 408 to determine a corresponding packet scheduler from among the packet schedulers 408.1 through 408.$k$ and to cause the FIRO memory queue 406 to store the other packet header information 454. The push signal 456 can represent an exemplary embodiment of the push signal 156 as described above in FIG. 1. Optionally, the packet parser 402 can provide a packet type signal 458 to the packet parser 402 to allow the packet schedulers 408.1 through 408.$k$ to classify the packet header of the input data packet 450 and/or to prioritize the packet header of the input data packet 450 to implement an egress port arbitration mechanism for delivery of the packet header of the input data packet 450.

The demultiplexer 404 determines, upon assertion of the push signal 456, the corresponding packet scheduler from among the packet schedulers 408.1 through 408.$k$ to store the other packet header information 454 within based upon the routing information 452. As to be described in further detail below, the packet schedulers 408.1 through 408.$k$ are associated with corresponding egress ports from among the multiple egress ports. As such, the demultiplexer 404 uses the routing information 452 to determine a corresponding egress port from among the multiple egress ports that the packet header of the input data packet 450 is to be delivered. Thereafter, the demultiplexer 404 provides a corresponding scheduler read signal from among packet scheduler read signals 460.1 through 460.$k$ to store the other packet header information 454 within a corresponding packet scheduler from the packet schedulers 408.1 through 408.$k$ associated with the corresponding egress port. As to be discussed in further detail below, this corresponding packet scheduler signals the arbiter 410 for access to the FIRO memory queue 406 to read the other packet information 454 from the FIRO memory queue 406.

The FIRO memory queue 406 writes the other packet header information 454 into a memory array upon assertion of the push signal 456 in a substantially similar as described above in FIG. 3. In the exemplary embodiment illustrated in FIG. 4, the FIRO memory queue 406 writes the other packet header information 454 into a memory sub-array from among the memory array that is flagged by the FIRO memory queue 406 as including invalid data. Thereafter, the FIRO memory queue 406 flags the memory sub-array as including valid data and provides a write pointer index signal 462 indicating the other packet header information 454 has been written into the FIRO memory queue 406 and has been flagged as including the valid data. The write pointer index signal 462 can represent an exemplary embodiment of the write pointer index signal 354 as described above in FIG. 3. Additionally, the memory queue 406 can read the other packet header information 454 stored within the memory array upon assertion of a pop signal 464 by the arbiter 410 to provide an output data signal 468 to the packet schedulers 408.1 through 408.$k$. The pop signal 464 and the output data signal 468 can represent exemplary embodiments of the pop signal 158 and the output data signal 168, respectively, as described above in FIG. 3. The assertion of the pop signal 464 causes the FIRO memory queue 406 to sequentially read the other packet header information 454 in accordance with a read pointer signal 466. The read pointer signal 466 can represent an exemplary embodiment of read pointer signal 352 as described above in FIG. 3. In the exemplary embodiment illustrated in FIG. 3, the FIRO memory queue 406 can represent an exemplary embodiment of the FIRO memory queue 300 as described above in FIG. 3.

The packet schedulers 408.1 through 408.$k$ store the other packet header information 454 from delivery to their corresponding egress ports from among multiple egress ports. In a first exemplary embodiment, one or more of the packet schedulers 408.1 through 408.$k$ can include a single FIFO memory queue, such the FIFO memory queue 100 as described above in FIG. 1. In this first exemplary embodiment, these packet schedulers provide corresponding access request signals from among access request signals 470.1 through 470.$k$ to the arbiter 410 to request access to the FIRO memory queue 406 to read the other packet header information 454 associated with their corresponding read pointers from read pointer signals 472.1 through 472.$k$. These packet schedulers provide their corresponding access request signals and their corresponding read pointers in response to their corresponding packet scheduler read signals from among the packet scheduler read signals 460.1 through 460.$k$. Also, these packet schedulers read the other packet header information 454 from the FIRO memory queue 406 in response to being addressed by a grant signal 474 provided by the arbiter 410. In a second exemplary embodiment, the packet schedulers 408.1 through 408.k can include a multiple FIFO memory queue, such the FIFO memory queue 200 as described above in FIG. 2. In this second exemplary embodiment, these packet schedulers operate in a substantially similar manner as the synchronous FIFO memory queue as described above in the first exemplary embodiment with the memory array being logically grouped into multiple memory sub-arrays for multiple packet types. These packet schedulers write the other packet header information 454, which is read from the FIRO memory queue 406, into a corresponding memory sub-array from among the multiple memory sub-arrays that is associated with the packet type signal 458.

The arbiter 410 determines which packet scheduler 408.1 through 408.k from among the packet schedulers 408.1 through 408.k are granted access to the FIRO memory queue 406 to read the other packet header information 454. In an exemplary embodiment, each of the packet schedulers 408.1 through 408.k can be assigned to a different priority in accordance with the egress port arbitration mechanism. In this exemplary embodiment, when multiple read requests 458 are provided by the packet schedulers 408.1 through 408.k, the arbiter 410 grants access to a packet scheduler from among the packet schedulers 408.1 through 408.k having the highest priority to read the other packet header information 454. The arbiter 410 provides the grant signal 474 to the packet schedulers 408.1 through 408.k to address the packet scheduler from among the packet schedulers 408.1 through 408.k granted access to the FIRO memory queue 406. Thereafter, the arbiter 410 provides the pop signal 464 and a corresponding read pointer signal from among the read pointer signals 472.1 through 472.k which corresponds to the packet scheduler that has been granted access to the FIRO memory queue 406 as the read pointer signal 466.

Figure 5A:
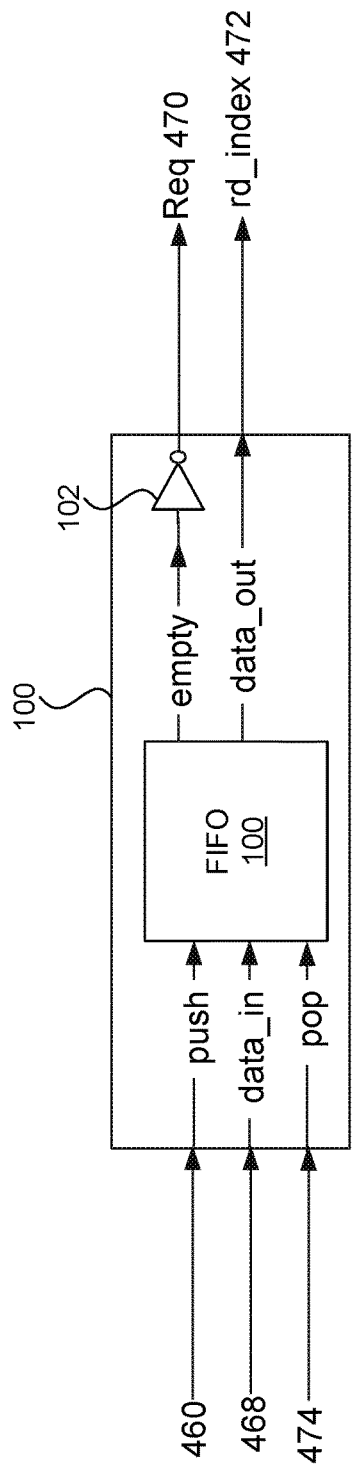
FIG. 5A illustrates a block diagram of a first packet scheduler that can be implemented within the exemplary packet router according to an exemplary embodiment of the present disclosure.

Exemplary Packet Schedulers that can be Implemented with the Exemplary Packet Router As described above, each of the packet schedulers 408.1 through 408.k can include a synchronous FIFO, such the FIFO memory queue 100 as described above in FIG. 1 and/or the FIFO memory queue 200 as described above in FIG. 2. Various exemplary embodiment for these packet schedulers are further described in FIG. 5A and in FIG. 5B. FIG. 5A illustrates a block diagram of a first packet scheduler that can be implemented within the exemplary packet router according to an exemplary embodiment of the present disclosure. In the exemplary embodiment illustrated in FIG. 5A, a packet scheduler 500 includes the FIFO memory queue 100 and an inverting circuit 502. For simplicity, not all of the signals input to and/or output from the FIFO memory queue 100 as described above in FIG. 1 are illustrated in FIG. 5A.

In the exemplary embodiment illustrated in FIG. 5A, the packet scheduler 500 receives a packet scheduler read signal 460 from among the packet scheduler read signals 460.1 through 460.k, the output data signal 468, and the grant signal 474. As illustrated in FIG. 5A, the FIFO memory queue 100 uses the packet scheduler read signal 460 as the push signal 156, the output data signal 468 as the input data signal 160, and the grant signal 474 as the pop signal 158 as described above in FIG. 1 to write the other packet header information 454 from the FIRO memory queue 406 in response to be granting access to the FIRO memory queue 406 by the arbiter 410. As described above in FIG. 1, the FIFO memory queue 100 provides the empty signal 162 being at a logical one to indicate no valid data is stored in the FIFO memory queue 100 or at a logical zero to indicate valid data is stored in the FIFO memory queue 100 and the output data signal 168. As illustrated in FIG. 5A, the packet router 400 uses the output data signal 168 as a read pointer signal 472 from the read pointer signals 472.1 through 472.k. In an exemplary embodiment, the output data signal 168 represents a digital word, such as a routing address to provide an example, which is associated with the packet scheduler 500. In this exemplary embodiment, the FIRO memory queue 406 uses this routing address as a pointer to its memory array when reading the other packet header information 454 from the FIRO memory queue 406. In the exemplary embodiment illustrated in FIG. 5A, the inverting circuit 502 performs an inversion operation of the empty signal 162 to provide an access request signal 470 from among the access request signals 470.1 through 470.k to indicate the FIFO memory queue 100 is capable of reading the other packet header information 454 from the FIRO memory queue 406 when the access request signal 470 is at a logical zero.

Figure 5B:
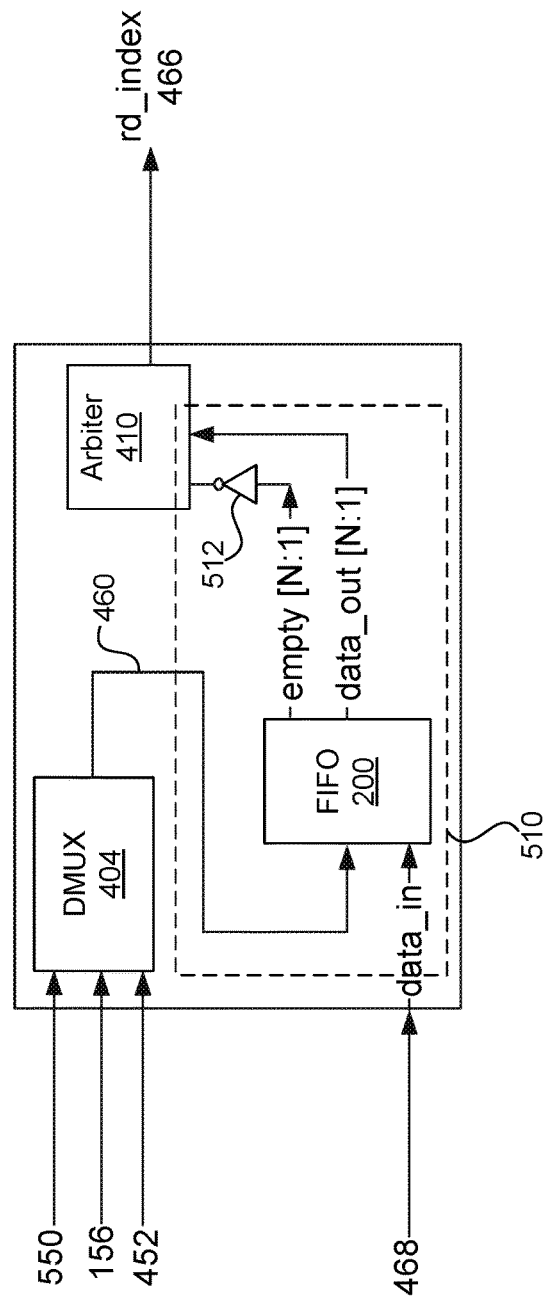
FIG. 5B illustrates a block diagram of a second packet scheduler that can be implemented within the exemplary packet router to an exemplary embodiment of the present disclosure.

FIG. 5B illustrates a block diagram of a second packet scheduler that can be implemented within the exemplary packet router according to an exemplary embodiment of the present disclosure. In the exemplary embodiment illustrated in FIG. 5B, a packet scheduler 510 includes the FIFO memory queue 200 and an inverting circuit 512. For simplicity, not all of the signals input to and/or output from the FIFO memory queue 200 as described above in FIG. 2 are illustrated in FIG. 5A.

As described above, data structures of the push signal 256, the pop signal 258, the input data signal 260, the empty signal 262, and the output data signal 268 additionally include address bits that unique a memory sub-array from among the r memory sub-arrays of the memory array of the FIFO memory queue 200. In the exemplary embodiment illustrated in FIG. 5B, the demultiplexer 404, as described above in FIG. 4, provides the scheduler read signal 460 from among packet scheduler read signals 460.1 through 460.k to cause the packet scheduler 510 to store the other packet header information 454. In this exemplary embodiment, the demultiplexer 404 provides a packet type signal 550 indicating a packet type, as described above in FIG. 4, to indicate which memory sub-array from among the r memory sub-arrays of the memory array of the FIFO memory queue 200 is to store the other packet header information 454.

In the exemplary embodiment illustrated in FIG. 5B, the packet scheduler 510 receives the packet scheduler read signal 460 from the demultiplexer 404. As illustrated in FIG. 5B, the FIFO memory queue 200 use the packet scheduler read signal 460 as the push signal 256, the output data signal 468 as the input data signal 260, and the grant signal 474 as the pop signal 258 as described above in FIG. 2 to write the other packet header information 454 from the FIRO memory queue 406 in response to be granting access to the FIRO memory queue 406 by the arbiter 410.

As illustrated in FIG. 5B, the arbiter uses the output data signal 268 as a read pointer signal 472 from the read pointer signals 472.1 through 472.k to determine the read pointer signal 466 as described above in FIG. 4. In an exemplary embodiment, the output data signal 268 represents a digital word, such as a routing address to provide an example, to uniquely identify the packet scheduler 510 and/or an address to uniquely identify the memory sub-array from among the r memory sub-arrays of the memory array of the FIFO memory queue 200 that is to store the other packet header information 454 from the FIRO memory queue 406. In this exemplary embodiment, the FIRO memory queue 406 uses this routing address and uniquely identifying address as a pointer to its memory array when reading the other packet header information 454 from the FIRO memory queue 406. In the exemplary embodiment illustrated in FIG. 5B, the inverting circuit 512 performs an inversion operation of the empty signal 162 to provide an access request signal 470 from among the access request signals 470.1 through 470.k to indicate the FIFO memory queue 200 is capable of reading the other packet header information 454 from the FIRO memory queue 406 when the access request signal 470 is at a logical zero.

Exemplary Multiple First in, Random Out (FIRO) Architectures

The exemplary embodiments to follow describe a multiple FIRO memory queue whereby the memory array can be logically partitioned into r different memory sub-arrays. As to be described below, the multiple FIRO memory queue can partition the memory array to be between one memory sub-array to implement the single FIRO memory queue as described above in FIG. 3 and multiple memory sub-arrays to implement the multiple FIRO memory queue as to be described in further detail below in FIG. 6.

Figure 6:
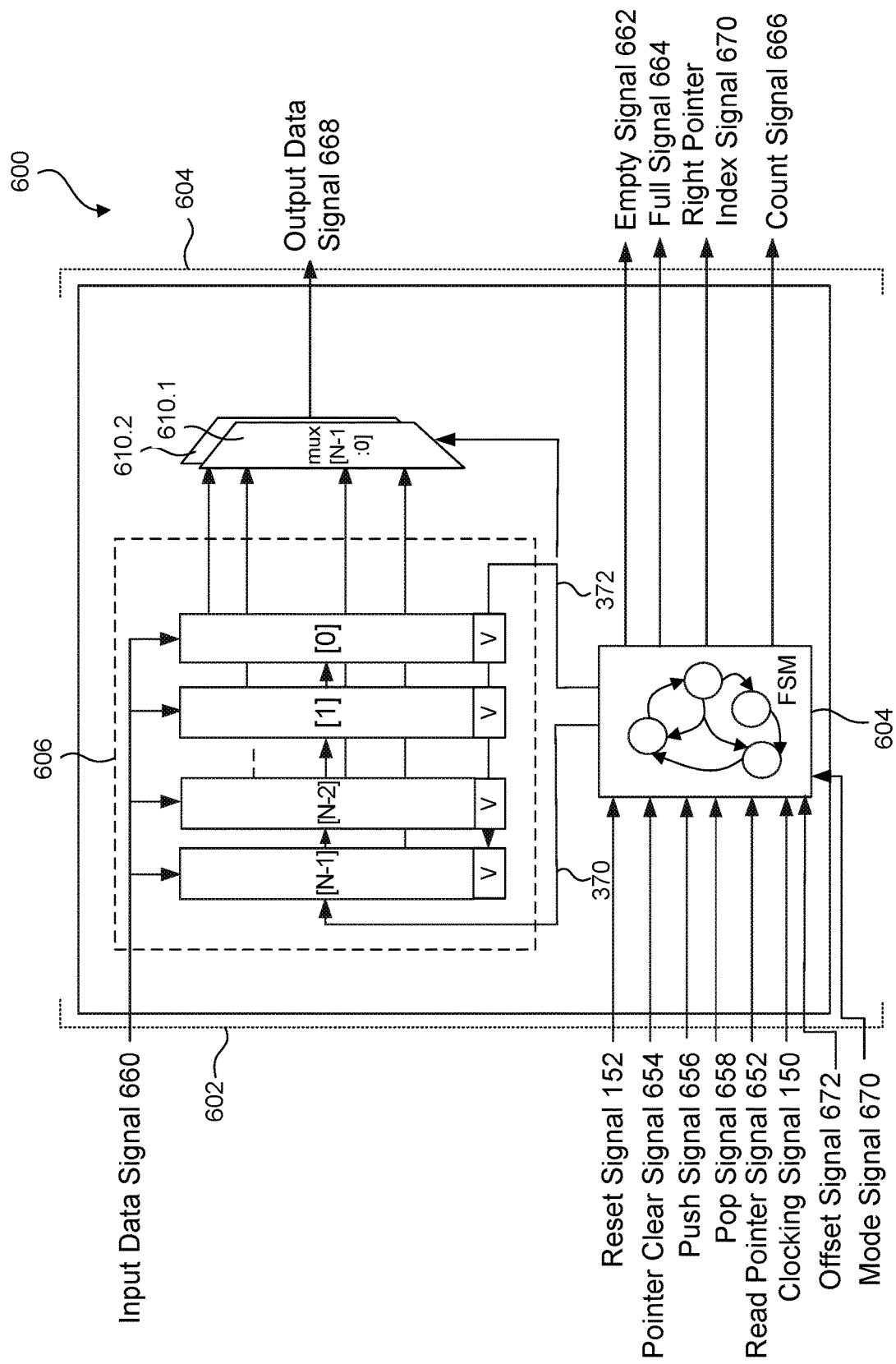
FIG. 6 illustrates a block diagram of an exemplary multiple first in, random out (FIRO) memory queue according to an exemplary embodiment of the present disclosure.

FIG. 6 illustrates a block diagram of an exemplary multiple first in, random out (FIRO) memory queue according to an exemplary embodiment of the present disclosure. Generally, a FIRO memory queue 600 represents a synchronous multiple FIRO having a memory array as described above in FIG. 3 being logically partitioned into r memory sub-arrays to implement r independently operated FIRO memory queues. As to be discussed below, the FIRO memory queue 600 can include control logic to manage various read and write pointers, to generate various status flags, and/or to provide various handshaking signals for interfacing with various electrical, mechanical, and/or electro-mechanical circuits. In an exemplary embodiment, the control logic can include a finite state machine (FSM) implemented in hardware and/or software. In this exemplary embodiment, the FSM can include a register to store one or more of state variables of the FSM and/or various blocks of combinational logic to determine one or more transitions between states of the FSM. In general, the memory array includes multiple memory storage elements which are arranged in a series of rows and a series of columns to form an array. In another exemplary embodiment, the series of columns can be implemented using multiple registers to form an array of multiple registers also referred to as a register bank. As illustrated in FIG. 6, the FIRO memory queue 600 includes an input or write port 602, an output or read port 604, a register bank 606, an FSM 608, and data queues 610.1 through 610.r. The FIRO memory queue 600 operates in a substantially similar manner as the FIRO memory queue 300 described above in FIG. 3; therefore, only differences between the FIRO memory queue 300 and the FIRO memory queue 600 are to be described in further detail below.

The register bank 606, as illustrated in FIG. 6, can include multiple registers. In an exemplary embodiment, the register bank 606 can be implemented using a random-access memory (RAM) and/or a register file to provide some examples. Moreover, the FSM 608 logically partitions multiple registers of the register bank 606 into r groups of registers, for example, two (2) groups of registers with the integer r being designated by a mode signal 670 and the number of registers in, or offset between, registers in into r groups of registers being designated by an offset signal 672. Furthermore, data structures of various signals, such as the pointer clear signal 654, the push signal 656, the pop signal 658, the input data signal 660, the empty signal 662, the full signal 664, the count signal 666, and the output data signal 668 to provide some examples, additionally include address bits that unique identify groups of registers from among the r groups of registers. The FSM 608 uses these address bits to apply these signals to a group of registers from among the r groups of registers which corresponds to these address bits. In an exemplary embodiment, these signals can be represented as $<B_X \ldots B_0><A_Y \ldots A_0>$ with the bits $<B_X \ldots B_0>$ representing the pointer clear signal 354, the push signal 356, the pop signal 658, the input data signal 360, the empty signal 362, the full signal 364, the count signal 366, or the output data signal 368 as described above in FIG. 3 and the bits $<A_X \ldots A_0>$ represent address bits to uniquely identify a group of registers from among the r groups of registers.

During the read operation, the assertion of the pop signal 658 causes the FSM 608 to provide the read/read control signal 650 to access a register element from among the register bank 606 that is associated with the read pointer signal 652. In the exemplary embodiment illustrated in FIG. 3, register bank 606 provides the data stored in this register element to a data queue from among the data queues 610.1 through 610.r that is identified in the pop signal 658. The FIRO memory queue 600 sequentially reads the m-bits of the output data signal 368 from the data queue that is identified in the pop signal 658 in accordance with the read pointer signal 652. Thereafter, the FSM 608 flags the data stored within this register element to be invalid after reading the m-bits of the output data signal 368 from the data queue that is identified in the pop signal 658. The FSM 608 can provide a write pointer index signal 654 indicating which register elements from among the register bank 606 include invalid data and which register elements from among the register bank 606 include valid data to various electrical, mechanical, and/or electro-mechanical circuits. During the write operation, the assertion of the push signal 656 causes the FSM 608 to provide the read/write control signal 650 to access a register element from among the register bank 606 that is flagged as including the invalid data. The FIRO memory queue 600 thereafter writes, also referred to as pushes, the m-bits of the input data signal 660 into this register element. Thereafter, FSM 608 of the FIRO memory queue 600 flags the data stored within this register element as being valid data.

Figure 7:
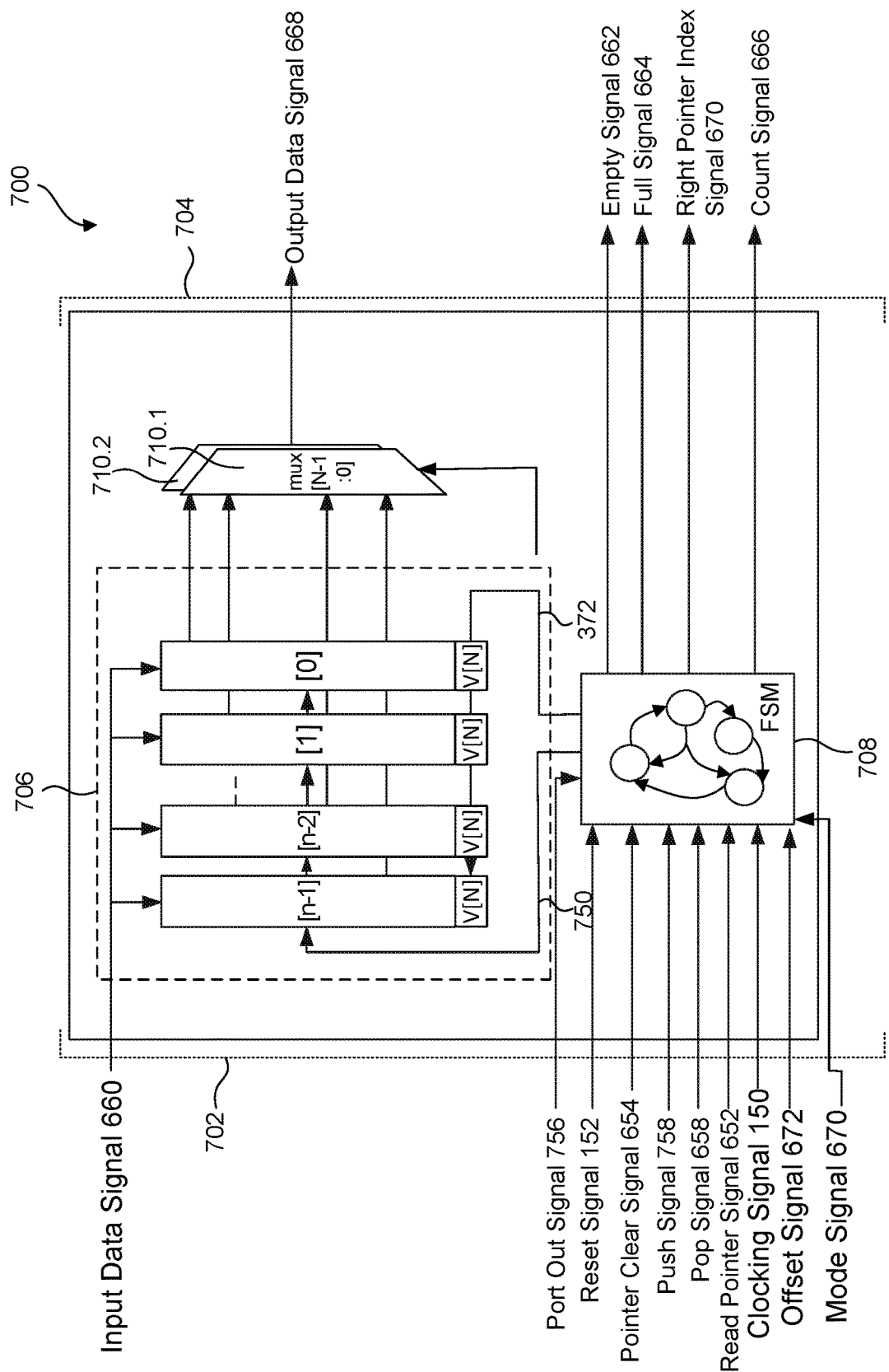
FIG. 7 illustrates a block diagram of a second exemplary multiple first in, random out (FIRO) memory queue according to an exemplary embodiment of the present disclosure.

FIG. 7 illustrates a block diagram of a second exemplary multiple first in, random out (FIRO) memory queue according to an exemplary embodiment of the present disclosure. Generally, a FIRO memory queue 700 represents a synchronous multiple FIRO having a memory array as described above in FIG. 3 being logically partitioned into r memory sub-arrays to implement r independently operated FIRO memory queues. As to be discussed below, the FIRO memory queue 700 can include control logic to manage various read and write pointers, to generate various status flags, and/or to provide various handshaking signals for interfacing with various electrical, mechanical, and/or electro-mechanical circuits. In an exemplary embodiment, the control logic can include a finite state machine (FSM) implemented in hardware and/or software. In this exemplary embodiment, the FSM can include a register to store one or more of state variables of the FSM and/or various blocks of combinational logic to determine one or more transitions between states of the FSM. In another exemplary embodiment, the memory array can be implemented using an array of multiple registers also referred to as a register bank. As illustrated in FIG. 7, the FIRO memory queue 700 includes an input or write port 702, an output or read port 704, a register bank 706, an FSM 708, and data queues 710.1 through 710.r. The FIRO memory queue 700 operates in a substantially similar manner as the FIRO memory queue 600 described above in FIG. 6; therefore, only differences between the FIRO memory queue 600 and the FIRO memory queue 700 are to be described in further detail below.

During the write operation, the assertion of the push signal 756 causes the FSM 708 to provide the read/write control signal 750 to access register element from among the register bank 706 that is flagged as including the invalid data. The FIRO memory queue 600 thereafter writes, also referred to as pushes, the m-bits of the input data signal 660 into this register element. Thereafter, FSM 708 of the FIRO memory queue 700 flags the data stored within this register element as being valid data. Otherwise, the assertion of the push signal 758 causes the FSM 708 to provide the read/write control signal 750 to access multiple register elements from among the register bank 706 that are flagged as including the invalid data. The FIRO memory queue 600 thereafter writes, also referred to as pushes, the m-bits of the input data signal 660 into these register elements. Thereafter, FSM 708 of the FIRO memory queue 700 flags the data stored within these register elements as being valid data.

Exemplary Packet Router Having the Exemplary Multiple FIRO Memory Queue

Figure 8:
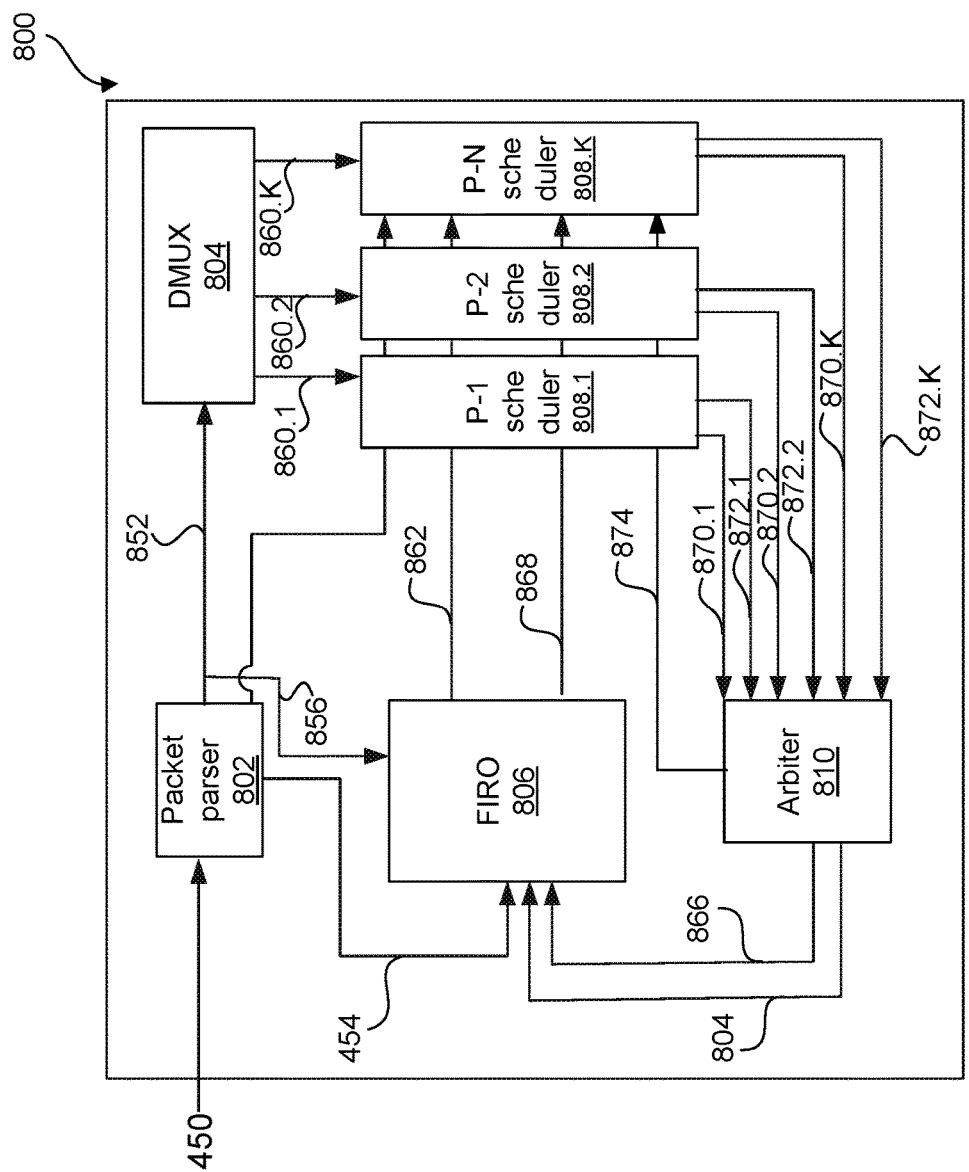
FIG. 8 illustrates a block diagram of an exemplary packet router having the exemplary single FIRO memory queue according to an exemplary embodiment of the present disclosure.

FIG. 8 illustrates a block diagram of an exemplary packet router having the exemplary single FIRO memory queue according to an exemplary embodiment of the present disclosure. In the exemplary embodiment illustrated in FIG. 8, a packet router 800 routes a packet header of an input data packet received at an ingress port to provide a packet header for an output data packet at a corresponding egress port from among multiple egress ports based upon information within a packet header of the input data packet. In the exemplary embodiment illustrated in FIG. 8, the packet router 800 includes a packet parser 802, a demultiplexer 804, a FIRO memory queue 806, the packet schedulers 408.1 through 408.k, and the arbiter 410. The packet router 800 operates in a substantially similar manner as the packet router 400 described above in FIG. 4; therefore, only differences between the packet router 800 and the packet router 400 are to be described in further detail below.

In the exemplary embodiment illustrated in FIG. 8, the packet parser 802 can assert a push signal 850 to enable the demultiplexer 808 to determine one or more corresponding packet schedulers from among the packet schedulers 408.1 through 408.k. The push signal 850 can represent an exemplary embodiment of the push signal 756 or the push signal 758 described above in FIG. 7. The demultiplexer 404 determines, upon assertion of the push signal 850, the corresponding packet scheduler from among the packet schedulers 408.1 through 408.k to enable based upon the routing information 452 in response to the push signal 850 being the push signal 756 or multiple corresponding packet schedulers from among the packet schedulers 408.1 through 408.k to enable based upon the routing information 452 in response to the push signal 850 being the push signal 758. The FIRO memory queue 406 writes the other packet header information 454 into a memory array upon assertion of the push signal 456 in a substantially similar as described above in FIG. 3. The FIRO memory queue 806 reads and writes the other packet header information 454 into in a substantially similar as described above in FIG. 7.

Technology Support EDA System/Workflow Explanation

Figure 9:
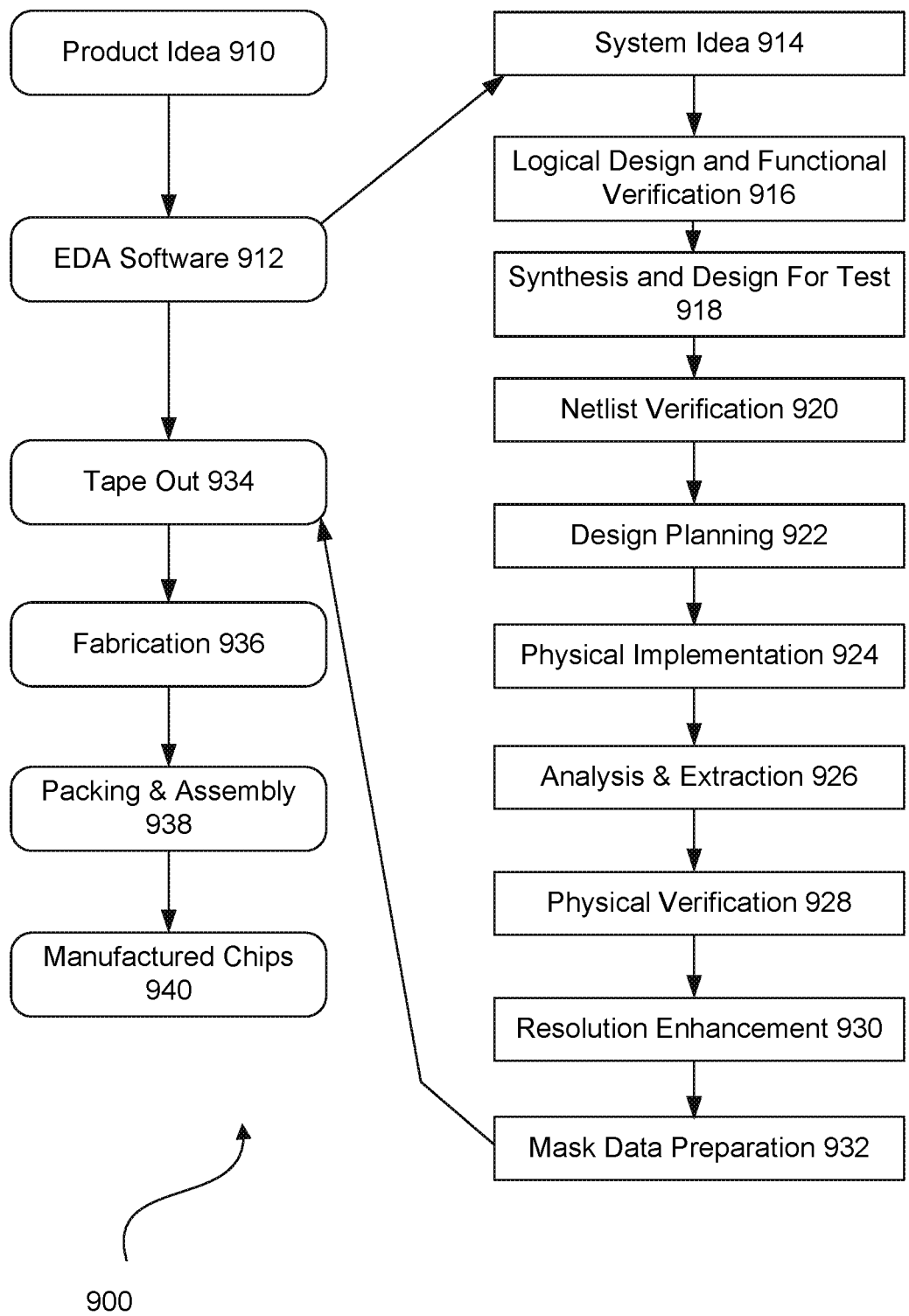
FIG. 9 depicts a flowchart of various operations in the design and fabrication of an integrated circuit according to an exemplary embodiment of the present disclosure.

FIG. 9 illustrates various processes 900 performed in the design, verification and fabrication of an item of manufacture such as an integrated circuit using software tools with a computer, and possibly special hardware-assisted tools, to transform and verify design data and instructions that represent the integrated circuit. The term 'EDA' signifies the term 'Electronic Design Automation'. These processes start with the creation of a product idea 910 with information supplied by a designer, information which is transformed during a process to create an item of manufacture (referred to herein as a design or device) that uses an EDA software tool 912, which may also be signified herein as EDA software, as a design tool, or a verification tool. When the design is finalized, it can be taped-out 934, which typically is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly processes 938 are performed, which result in the finished integrated circuit 940 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language ('HDL') such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level ('RTL') description, a gate-level description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, which is much used for detailed descriptions of analog-based circuits.

A design process that uses an EDA software tool 912 includes processes 914 to 932, which are described below. This design flow description is for illustration purposes only and is not meant to limit the present disclosure. For example, an actual integrated circuit design may require a designer to perform the design operations in a different sequence than the sequence described herein.

During system design 914, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 916, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, Designware, Magellan, Formality, ESP and Leda products. Exemplary emulator and prototyping products also available from Synopsys that can be used at this state include: Zebu® and Protolink® (® signifies 'Registered Trademark').

During synthesis and design for test 918, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 920, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 922, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 924, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 926, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 928, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 930, geometric manipulations of the layout are performed to improve manufacturability of the design. Exemplary EDA software products from Synopsys, Inc. of Mountain View, Calif. that can be used at this stage include: Proteus products.

During tape-out, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 932, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 912.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

Technology Support Hardware/Software Equivalence

Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term 'processor' can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. No scientific evidence exists that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

The various exemplary memory queues and/or exemplary packet routers as described above can implemented using one or more modules. The one or more modules can be considered to be one or more algorithms that can be executed, or are executed, by a computer or a computer system. The computer and/or the computer systems can execute the one or more modules to perform the one or more algorithms to configure the one or more modules to operate as described above. In an exemplary embodiment, the exemplary register banks as described above can be implemented as a module. In this exemplary embodiment, the computer and/or computer system can execute the module to perform an algorithm to configure the module to operate in the read operation and/or write operation as described above.

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence of transformations (also referred to as 'operations') applied to the data and information (or in the case of ROMs and RAMS, transforming data and information by using the input information as an address for memory that stores output data and information), to perform aspects of the present innovations, embodiments and/or examples of the disclosure.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The 'substance' of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term 'software application' signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the C programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software or has an interface device that receives the software over a network. This process is discussed in the General Computer Explanation section.

Technology Support General Computer Explanation

Figure 10A:
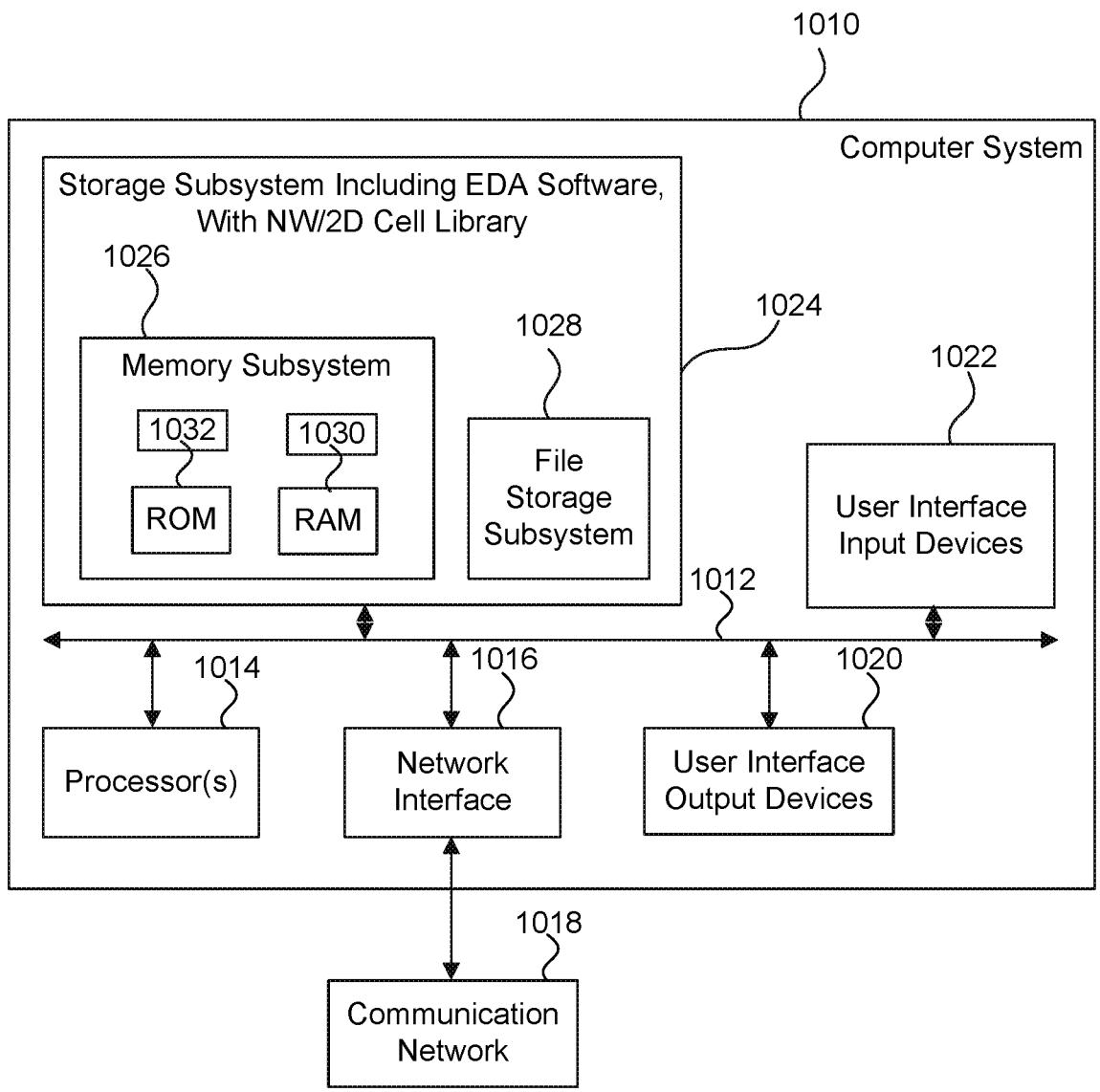
FIGS. 10A, 10B and 10C depict simplified block diagrams of a computer system suitable for use with embodiments of the technology, as well as circuit design and circuit embodiments of the technology.
Figure 10B:
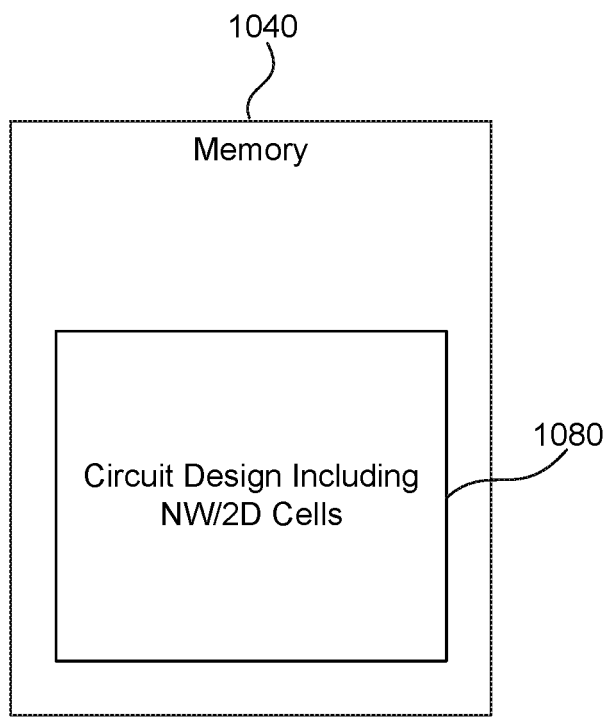
Figure 10C:
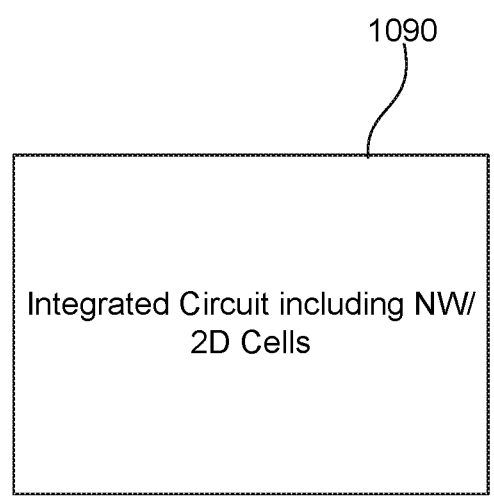

FIGS. 10A, 10B and 10C are simplified block diagrams of a computer system suitable for use with embodiments of the technology, as well as circuit design and circuit embodiments of the technology.

In FIG. 10A, computer system 1010 typically includes at least one computer or processor 1014 which communicates with a number of peripheral devices via bus subsystem 1012. Typically, the computer can include, or the processor can be, any of a microprocessor, graphics processing unit, or digital signal processor, and their electronic processing equivalents, such as an Application Specific Integrated Circuit ('ASIC') or Field Programmable Gate Array ('FPGA'). The terms 'processor' and 'computer' are further defined below. These peripheral devices may include a storage subsystem 1024, comprising a memory subsystem 1026 and a file storage subsystem 1028, user interface input devices 1022, user interface output devices 1020, and a network interface subsystem 1016. The input and output devices allow user interaction with computer system 1010.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine capable of executing instructions (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the sets of instructions discussed herein. Due to the ever-changing nature of computers and networks, the description of computer system 1010 depicted in FIG. 10A is intended only as one example for purposes of illustrating the preferred embodiments. Many other configurations of computer system 1010 are possible having more or less components than the computer system depicted in FIG. 10A.

Network interface subsystem 1016 provides an interface to outside networks, including an interface to communication network 1018, and is coupled via communication network 1018 to corresponding interface devices in other computer systems or machines. Communication network 1018 may comprise many interconnected computer systems, machines and communication links. These communication links may be wireline links, optical links, wireless links, or any other devices for communication of information. Communication network 1018 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 1022 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term 'input device' is intended to include all possible types of devices and ways to input information into computer system 1010 or onto communication network 1018. User interface input devices typically allow a user to select objects, icons, text and the like that appear on some types of user interface output devices, for example, a display subsystem.

User interface output devices 1020 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term 'output device' is intended to include all possible types of devices and ways to output information from computer system 1010 to the user or to another machine or computer system.

Memory subsystem 1026 typically includes a number of memories including a main random-access memory (RAM') 1030 (or other volatile storage device) for storage of instructions and data during program execution and a read only memory (ROM') 1032 in which fixed instructions are stored. File storage subsystem 1028 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 1028.

Bus subsystem 1012 provides a device for letting the various components and subsystems of computer system 1010 communicate with each other as intended. Although bus subsystem 1012 is shown schematically as a single bus, alternative embodiments of the bus subsystem may use multiple busses. For example, RAM-based main memory can communicate directly with file storage systems using Direct Memory Access (DMA') systems.

FIG. 10B depicts a memory 1040 such as a non-transitory, computer readable data and information storage medium associated with file storage subsystem 1028, and/or with network interface subsystem 1016, and can include a data structure specifying a circuit design. The memory 1040 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 10C signifies an integrated circuit 1090 created with the described technology that includes one or more cells selected, for example, from a cell library.

CONCLUSION

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof, solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed:

1. A multiple first in, first out (FIFO) memory queue, comprising:
    a memory array having a plurality of memory storage elements, the plurality of memory storage elements being logically portioned into a plurality of groups of memory storage elements to form a plurality of memory sub-arrays; and
    control logic configured to:
        access a first memory storage element within a first memory sub-array from among the plurality of memory sub-arrays that is associated with a read pointer;
        sequentially read a first plurality of bits starting from a top entry of a first column of memory storage elements from among a plurality of columns of memory storage elements of the memory array having the first memory storage element to provide an output data signal, the top entry being associated with a corresponding most significant storage element from among the first column of memory storage elements,
        access a second memory storage element within the first memory sub-array that is associated with a write pointer, and
        sequentially write a second plurality of bits associated with an input data signal to a second column of memory storage elements from among the plurality of columns having the second memory storage element starting from a bottom entry of the second column, the bottom entry being associated with a corresponding least significant storage element from among the second column of memory storage elements.

2. The multiple FIFO memory queue of claim 1, wherein the plurality of columns of memory storage elements are arranged to form a register bank having a plurality of registers.

3. The multiple FIFO memory queue of claim 1, wherein the control logic comprises:
    a finite state machine (FSM).

4. The multiple FIFO memory queue of claim 1, wherein a row of memory storage elements from a plurality of rows of memory storage elements is configured to store a plurality of flags, each flag from among the plurality of flags indicating whether its corresponding column of memory storage elements from among the plurality of columns of memory storage elements includes valid data or invalid data.

5. The multiple FIFO memory queue of claim 1, wherein the control logic is configured to:
    sequentially read the first plurality of bits in response to a pop signal being asserted, and
    sequentially write the second plurality of bits in response to a push signal being asserted.

6. The multiple FIFO memory queue of claim 5, wherein the control logic is configured to:
    sequentially read the first plurality of bits in response to an empty signal indicating the memory array includes valid data, and
    sequentially write the second plurality of bits in response to a full signal indicating the memory has available storage capacity to store the input data signal.

7. A single first in, random out (FIRO) memory queue, comprising:
    a memory array having a plurality of memory storage elements, the plurality of memory storage elements being arranged into a plurality of rows of memory storage elements and a plurality of columns of memory storage elements; and
    control logic configured to:
        access a first memory storage element within a first column of memory storage elements from among the plurality of columns of memory storage elements that is associated with a read pointer signal,
        sequentially read a first plurality of bits starting from the first memory storage element to provide an output data signal,
        flag the first column to indicate the first column includes invalid data in response to reading the first plurality of bits,
        access a second memory storage element within a second column of memory storage elements from among the plurality of columns of memory storage elements that has been flagged as including the invalid data, sequentially write a second plurality of bits associated with an input data signal into the second column, and flag the second column to indicate the second column includes valid data in response to writing the second plurality of bits.

8. The single FIRO memory queue of claim 7, wherein the plurality of columns of memory storage elements are arranged to form a register bank having plurality of registers.

9. The single FIRO memory queue of claim 7, wherein the control logic comprises:

a finite state machine (FSM).

10. The single FIRO memory queue of claim 7, wherein a row of memory storage elements from the plurality of rows of memory storage elements is configured to store a plurality of flags, each flag from among the plurality of flags indicating whether its corresponding column of memory storage elements from among the plurality of columns of memory storage elements includes the valid data or the invalid data.

11. The single FIRO memory queue of claim 7, wherein the control logic is configured to:

sequentially read the first plurality of bits in response to a pop signal being asserted, and sequentially write the second plurality of bits in response to a push signal being asserted.

12. The single FIRO memory queue of claim 11, wherein the control logic is configured to:

sequentially read the first plurality of bits in response to an empty signal indicating the memory array includes the valid data, and sequentially write the second plurality of bits in response to a full signal indicating the memory has available storage capacity to store the input data signal.

13. The single FIRO memory queue of claim 7, wherein the control logic is further configured to provide a write pointer index signal indicating which columns of memory storage elements from among the plurality of columns of memory storage elements have been flagged as including the invalid data or which columns of memory storage elements from among the plurality of columns of memory storage elements have been flagged as including the valid data.

14. A multiple first in, random out (FIRO) memory queue, comprising:

a memory array having a plurality of memory storage elements, the plurality of memory storage elements being logically portioned into a plurality of groups of memory storage elements to form a plurality of memory sub-arrays; and control logic configured to:

access a first memory storage element within a first memory sub-array from among the plurality of memory sub-arrays that is associated with an address included with a read pointer signal;

sequentially read a first plurality of bits starting from the first memory storage element to provide an output data signal, flag a first column of memory storage elements from among a plurality of columns of memory storage elements of the memory array having the first memory storage element to indicate the first column includes invalid data in response to reading the first plurality of bits, access a second memory storage element within the first memory sub-array that has been flagged as including the invalid data, sequentially write a second plurality of bits associated with an input data signal to a second column of memory storage elements from among the plurality of columns of memory storage elements having the second memory storage element, and flag the second column to indicate the second column of memory storage elements includes valid data in response to writing the second plurality of bits.

15. The multiple FIRO memory queue of claim 14, wherein the plurality of columns of memory storage elements are arranged to form a register bank having a plurality of registers.

16. The multiple FIRO memory queue of claim 14, wherein the control logic comprises:

a finite state machine (FSM).

17. The multiple FIRO memory queue of claim 14, wherein a row of memory storage elements from a plurality of rows of memory storage elements of the memory array being configured to store a plurality of flags, each flag from among the plurality of flags indicating whether its corresponding column of memory storage elements from among the plurality of columns of memory storage elements includes the valid data or the invalid data.

18. The multiple FIRO memory queue of claim 14, wherein the control logic is configured to:

sequentially read the first plurality of bits in response to a pop signal being asserted and having an address indicating the first memory sub-array, and sequentially write the second plurality of bits in response to a push signal being asserted and having the address indicating the first memory sub-array.

19. The multiple FIRO memory queue of claim 18, wherein the control logic is configured to:

sequentially read the first plurality of bits in response to an empty signal indicating the memory array includes the valid data, and sequentially write the second plurality of bits in response to a full signal indicating the memory has available storage capacity to store the input data signal.

20. The multiple FIRO memory queue of claim 14, wherein the control logic is further configured to provide a write pointer index signal indicating which columns of memory storage elements from among the plurality of columns of memory storage elements have been flagged as including the invalid data or which columns of memory storage elements from among the plurality of columns of memory storage elements have been flagged as including the valid data.

* * * * *